(12) United States Patent
Wu

(10) Patent No.: US 9,171,520 B2
(45) Date of Patent: Oct. 27, 2015

(54) ARRAY SUBSTRATE, METHOD FOR CONTROLLING THE SAME AND DISPLAY PANEL INCLUDING THE ARRAY SUBSTRATE

(71) Applicant: BOE TECHNOLOGY GROUP CO., LTD., Beijing (CN)

(72) Inventor: Yanbing Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 232 days.

(21) Appl. No.: 13/703,799

(22) PCT Filed: Oct. 16, 2012

(86) PCT No.: PCT/CN2012/083027
§ 371 (c)(1),
(2) Date: Dec. 12, 2012

(87) PCT Pub. No.: WO2013/075558
PCT Pub. Date: May 30, 2013

(65) Prior Publication Data
US 2013/0128173 A1 May 23, 2013

(30) Foreign Application Priority Data
Nov. 21, 2011 (CN) .......................... 2011 1 0372401

(51) Int. Cl.
*G02F 1/1335* (2006.01)
*G09G 5/00* (2006.01)
(Continued)

(52) U.S. Cl.
CPC ................ *G09G 5/00* (2013.01); *G02F 1/1368* (2013.01); *G02F 1/136286* (2013.01);
(Continued)

(58) Field of Classification Search
CPC ........... H04N 13/0452; H04N 13/0454; G02B 27/22; G02B 27/26
USPC ........................................................... 349/15
See application file for complete search history.

(56) References Cited

U.S. PATENT DOCUMENTS 8,519,908 B2 *  8/2013  Lee et al. ........................ 345/6
8,810,569 B2 *  8/2014  Hwang ......................... 345/419
(Continued)

FOREIGN PATENT DOCUMENTS

CN 101867836 A 10/2010
CN 102081911 A 6/2011
(Continued)

OTHER PUBLICATIONS

International Search Report dated Jan. 24, 2013; PCT/CN2012/083027.
(Continued)

*Primary Examiner* — Jessica M Merlin
*Assistant Examiner* — Mark Teets
(74) *Attorney, Agent, or Firm* — Ladas & Parry LLP

(57) ABSTRACT

According to an embodiment of the invention, there is disclosed an array substrate, comprising: data lines; first and second gate lines, the first and second gate lines and the data lines crossing with each other so as to define sub-pixel structures; each of the sub-pixel structures comprising first and second sub-pixels; a first control line, insulated from the first and second gate lines; and first switch devices, each for making the first gate line and the second gate line corresponding to the first sub-pixel and the second sub-pixel in the same sub-pixel structure connected or disconnected under the control of the first control line, wherein in each of the sub-pixel structures, the first gate line is connected to the first sub-pixel, the second gate line is connected to the second sub-pixel, and the first sub-pixel and the second sub-pixel are connected to the same data line.

9 Claims, 3 Drawing Sheets

(51) Int. Cl.
  *H01L 27/15* (2006.01)
  *G02F 1/1368* (2006.01)
  *H04N 13/04* (2006.01)
  *G02F 1/1362* (2006.01)
  *G02B 27/22* (2006.01)
  *G02B 27/26* (2006.01)
  *G02F 1/1343* (2006.01)

(52) U.S. Cl.
  CPC ......... *H01L 27/156* (2013.01); *H04N 13/0452* (2013.01); *H04N 13/0454* (2013.01); *G02B 27/22* (2013.01); *G02B 27/26* (2013.01); *G02F 2001/134345* (2013.01); *G09G 2300/0443* (2013.01)

(56) References Cited

U.S. PATENT DOCUMENTS

| | | | |
|---|---|---|---|
| 8,836,613 B2 * | 9/2014 | Kim et al. | 345/4 |
| 8,836,692 B2 * | 9/2014 | Kim et al. | 345/214 |
| 8,866,805 B2 * | 10/2014 | Baek et al. | 345/211 |
| 8,878,748 B2 * | 11/2014 | Kim et al. | 345/4 |
| 8,885,029 B2 * | 11/2014 | Baek et al. | 348/51 |
| 8,890,948 B2 * | 11/2014 | Hwang et al. | 348/79 |
| 8,976,083 B2 * | 3/2015 | Kim et al. | 345/6 |
| 9,046,965 B2 * | 6/2015 | Yeh et al. | 1/1 |
| 2010/0265230 A1 | 10/2010 | Kang | |
| 2011/0128269 A1 * | 6/2011 | Lee et al. | 345/211 |
| 2011/0227886 A1 * | 9/2011 | Lee et al. | 345/204 |
| 2012/0274748 A1 * | 11/2012 | Hwang et al. | 348/51 |
| 2014/0063366 A1 * | 3/2014 | Zhang | 349/12 |

FOREIGN PATENT DOCUMENTS

| | | |
|---|---|---|
| CN | 102193260 A | 9/2011 |
| CN | 102654701 A | 9/2012 |
| WO | 2006/100950 A1 | 9/2006 |

OTHER PUBLICATIONS

First Chinese Office Action dated Jan. 30, 2014; Appln. No. 201110372401.6.

* cited by examiner (a)                  (b)

ARRAY SUBSTRATE, METHOD FOR CONTROLLING THE SAME AND DISPLAY PANEL INCLUDING THE ARRAY SUBSTRATE

BACKGROUND

Embodiments of the invention relate to an array substrate, a method for controlling the same and a display panel including the array substrate.

Stereoscopic display has become a big trend of the display field. And, the basic principle of the stereoscopic display is to produce a stereoscopy by utilizing a parallax, i.e., a left-eye picture is seen by the left eye of a person, and a right-eye picture is seen by his right eye. Herein, the left-eye and right-eye pictures are a pair of stereoscopic images having the parallax.

One mode to achieve the stereoscopy is a time serial manner, in which at a first time slot, a left-eye picture is displayed on a display and the displayed left-eye picture is only seen by the left eye of a viewer at this time; and at a second time slot, a right-eye picture is displayed on the display and the displayed right-eye picture is only seen by the right eye of the viewer. With persistence of vision of human eyes, a feeling is given to the person that the left-eye and right-eye pictures are simultaneously seen by the left and right eyes, thereby producing a stereoscopic sensation.

Another mode to achieve the stereoscopy is a parallel manner, in which at the same time, content for a left-eye picture is displayed by a part of pixels on a display, and content for a right-eye picture is displayed by another part of pixels. The content displayed by a part of the pixels only can be seen by the right eye and that displayed by another part only can be seen by the left eye by way of gratings, polarization spectacles, etc., so as to produce the stereoscopic sensation.

A polarization spectacles type stereoscopic display is one kind of mainstream technology in the current stereoscopic display field, and the basic constituting manner of the polarization spectacles type stereoscopic display is to install a device capable of adjusting a polarization direction of emitting lights in front of a display panel. The device may be a phase retarder plate, or may also be a liquid crystal cell, or other devices capable of adjusting the polarization directions of emitting lights from different pixels. The principle of a phase retarder plate type stereoscopic display is as shown in FIG. 1, and from top to bottom, there are a picture displayed by the display panel, the phase retarder plate, an emitting picture, and polarization spectacles for viewing. On the display panel, a right-eye picture and a left-eye picture are alternately shown in adjacent rows. The phase retarder plate is disposed in front of the display panel, one row has λ/2 retardation, and adjacent one row has zero retardation. As such, the polarization direction of emitting lights from pixels which correspond to the rows having the λ/2 retardation can be rotated by 90°. In this manner, only lights emitted by right-eye pixels can be seen by the right eye and only lights emitted by left-eye pixels can be seen by the left eye when the person wears polarization spectacles having such polarization directions that are perpendicular to each other for the left and right eyes, so as to produce a stereoscopic effect.

In a variety of stereoscopic displays of the polarization spectacles mode, a technology in which a phase retarder plate is employed takes the most favor. The basic structure of this stereoscopic display is that a phase retarder plate is attached to a display panel after they are precisely aligned. Different phase retardations can be produced with the use of different regions on the phase retarder plate, so that lights from different pixels emit in different polarization directions and a viewer can see a 3D effect when wearing polarization spectacles.

However, one of drawbacks for this 3D display is that the viewing angle in a perpendicular direction is very small (other polarization spectacles mode 3D displays each have this drawback). A simplified principle (in which only simplified, theoretical computation is given, but a directional result can be provided by it) that explains why the viewing angle for the polarization spectacles mode 3D display is narrow is schematically illustrated in FIG. 2, in which, DP is the display panel, and PR is the phase retarder plate. In FIG. 2, a is height of a pixel display area, b is width of a black matrix (BM) in a perpendicular direction, c is width of one stripe of the phase retarder plate, h is distance from the phase retarder plate to the display panel, θ is a 3D viewing angle, p=a+b, and p (the size of a pixel) is a constant. A good 3D effect can be seen only at a narrow, shadow region on a right side, here, the angle θ is an important parameter. A computation can be performed in accordance with the simplified principle view shown in FIG. 2, and the 3D viewing angle θ meets the following relation:

$$\tan\frac{\theta}{2} = \frac{2p + b - 2c}{2h}$$

It can be seen from the above relation that θ increases with the increase of a width b of the BM. Accordingly, a scheme in which an active BM is used is proposed, and its structure is shown in FIG. 3. In the scheme shown in FIG. 3, one sub-pixel unit is divided into two small pixels in the upper and in the lower, namely a first sub-pixel 1 and a second sub-pixel 2, and they are controlled separately. When a 2D display is carried out, the same content is displayed by the first sub-pixel 1 and the second sub-pixel 2; and when a 3D display is carried out, the second sub-pixel 2 represents black, which is equivalent to increasing of the width b of the BM for an original pixel, so that the 3D viewing angle can be improved.

However, in a general active BM scheme, the second sub-pixel 2 is controlled as a separate pixel, and as a result, the number of gate lines of the display panel will become twice as much as the original case, and the number of data signal lines will become twice as much as the original case. Thus, the control cost and the control difficulty are increased.

SUMMARY

According to embodiments of the invention, a display panel can be controlled easily, and an active black matrix is achieved.

According to an embodiment of the invention, there is provided an array substrate, comprising: data lines; first gate lines and second gate lines, the first and second gate lines and the data lines crossing with each other so as to define a plurality of sub-pixel structures arranged in a matrix form; each of the plurality of sub-pixel structures comprising a first sub-pixel and a second sub-pixel, and each of the first sub-pixel and the second sub-pixel including a pixel electrode and a thin film transistor, the thin film transistor for each of them comprising a gate, a source, a drain and an active layer; a first control line, insulated from the first gate lines and the second gate lines; and first switch devices, each for making the first gate line and the second gate line corresponding to the first sub-pixel and the second sub-pixel in the same sub-pixel structure connected or disconnected under the control of the first control line, wherein in each of the sub-pixel structures, the first gate line is connected to the first sub-pixel, the second gate line is connected to the second sub-pixel, and the first sub-pixel and the second sub-pixel are connected to the same data line.

As an example, each of the first switch devices is a first Thin Film Transistor (TFT), a gate of the first TFT is connected to the first control line, and a source and a drain thereof are connected to the first gate line and the second gate line, respectively.

As an example, the array substrate further comprises: a second control line, a third control line and second switch devices, each of the second switch devices for making the second control line and the second gate lines being connected or disconnected under the control of the third control line.

As an example, each of the second switch devices is a second TFT, a gate of the second TFT is connected to the third control line, and a source and a drain thereof are connected to the second control line and the second gate lines, respectively.

According to an embodiment of the invention, there is further disclosed a control method for controlling the above array substrate, comprising: in a 2D-display state, applying a signal for turning on the first switch devices to the first control line, so that the first switch devices are turned on; inputting a signal, which is inputted to the first gate line for the first sub-pixel, to the second gate line for the second sub-pixel simultaneously; charging the first sub-pixel and the second sub-pixel by the data line at the same time; inserting a black picture when to switchover to a 3D display state; applying a signal for turning off the first switch devices to the first control line, so that the first switch devices are turned off; inputting a signal on the first gate line only to the first sub-pixel, and charging the first sub-pixel by the data line.

As an example, the control method for the above array substrate according to the embodiment of the invention further comprises: inputting a signal for turning off the TFT in the second sub-pixel continuously to the second gate line by the second control line; in the 2D display state, applying a signal for turning off the second switch devices to the third control line, so that the second switch devices are turned off; in the 3D display state, applying a signal for turning on the second switch devices to the third control line, so that the second switch devices are turned on.

According to an embodiment of the invention, there is further provided a display panel, comprising: the above array substrate; a counter substrate, the counter substrate and the array substrate being disposed opposite to each other so as to form a liquid crystal cell; a liquid crystal material, filled in the liquid crystal cell, wherein the pixel electrodes for each of the sub-pixel structures of the array substrate are used to apply an electric field for controlling the rotation degree of the liquid crystal material, thereby performing a display operation.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiment 1

An example of an array substrate that can be applied to a 3D display device is provided by the embodiment 1 of the invention, and in the following, the example of the array substrate will be described in detail with reference to FIG. 4.

Only two sub-pixel structures are shown in the figure as an example, but it should be appreciated by those skilled in the art that other sub-pixel structures on the array substrate can use the shown structure.

Figure 1:
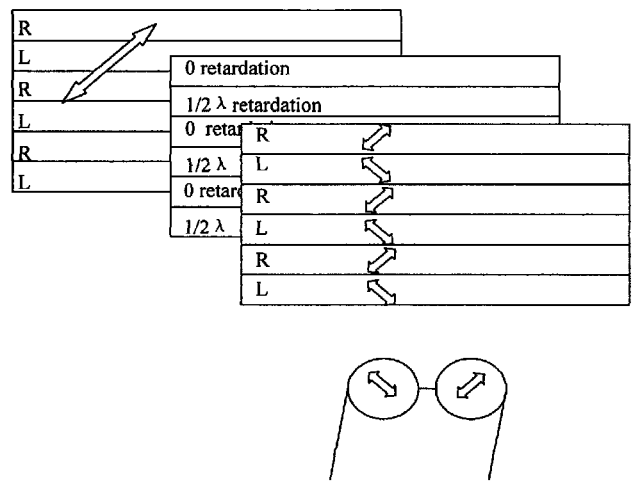
FIG. 1 is a schematic view showing the principle of achieving a 3D display with the use of a phase retarder plate in prior art.
Figure 2:
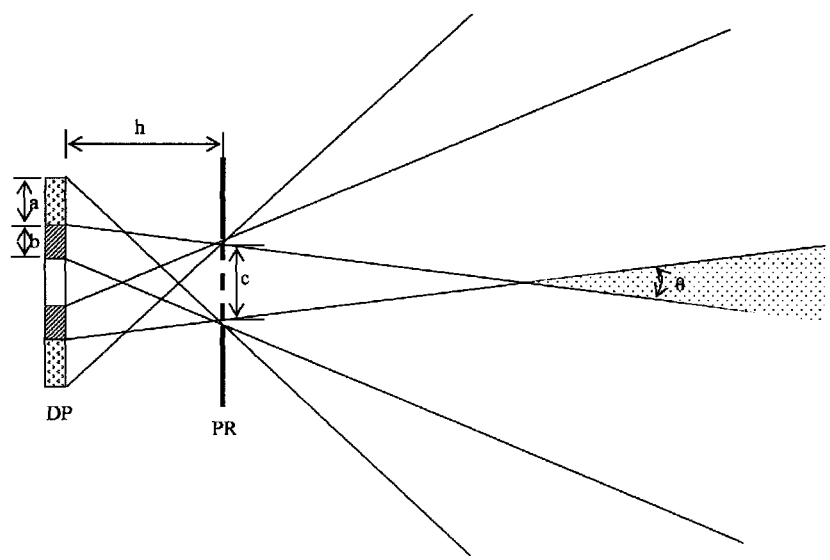
FIG. 2 is a schematic view showing the relationship between the viewing angle and a size of a black matrix for a 3D display.
Figure 3:
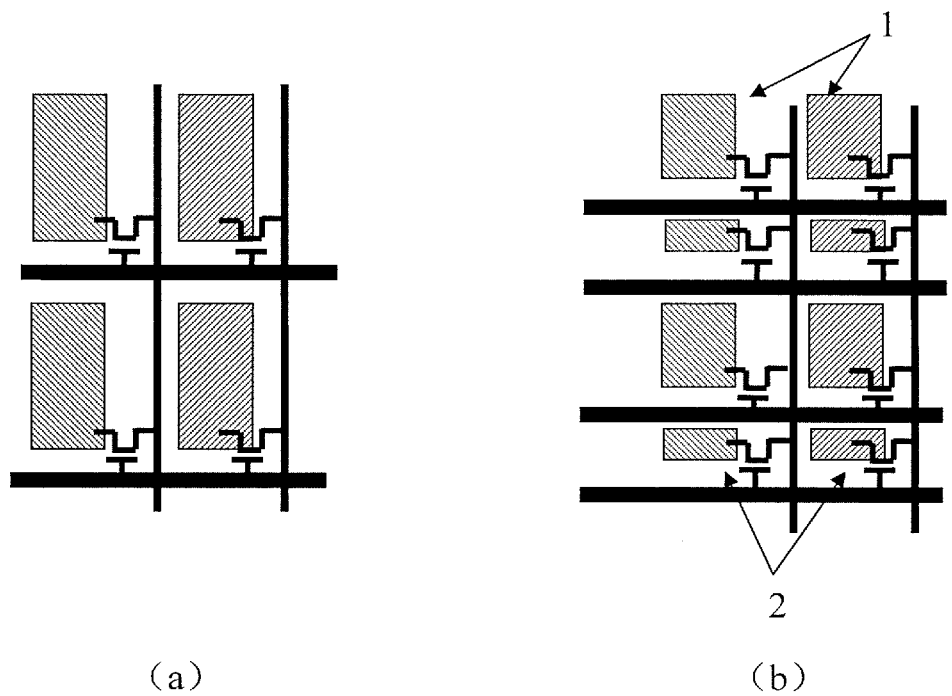
FIG. 3 is schematic view showing a structure of an array substrate in which an active black matrix is adopted to increase a viewing angle in prior art, wherein (a) shows the array substrate in which no active black matrix is used, and (b) shows the array substrate in which an active black matrix is used.
Figure 4:
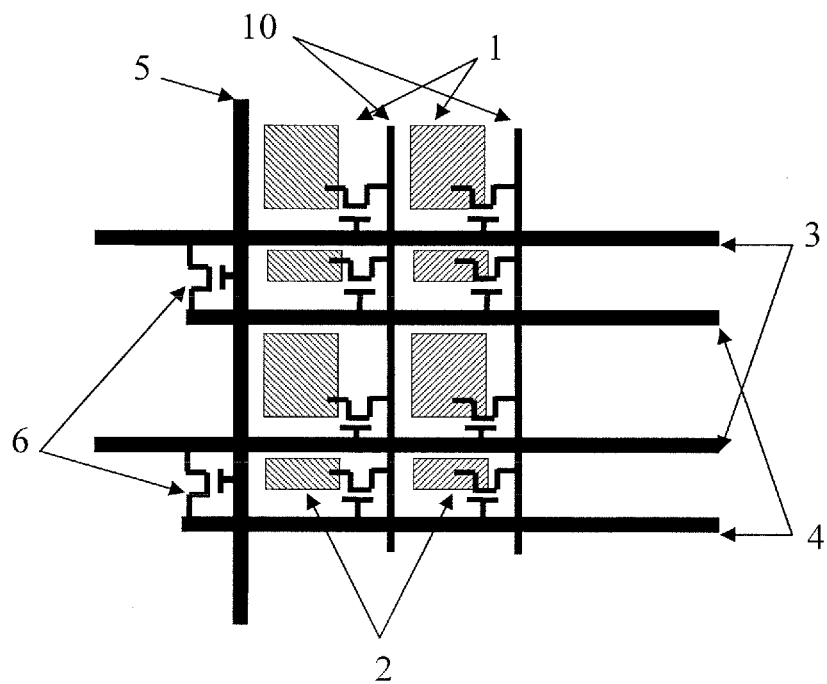
FIG. 4 is a schematic view showing a structure of an array substrate according to an embodiment of the invention.

As shown in FIG. 4, the array substrate in the embodiment comprises: data lines 10; first gate lines 3 and second gate lines 4, wherein the first and second gate lines 3 and 4 and the data lines 10 cross with each other so as to define a plurality of sub-pixel structures arranged in a matrix form; each of the plurality of sub-pixel structures includes a first sub-pixel 1 and a second sub-pixel 2, and each of the first sub-pixel 1 and the second sub-pixel 2 includes a pixel electrode and a thin film transistor (TFT), the respective thin film transistor for each of them includes a gate, a source, a drain and an active layer; a first control line 5; and first switch devices 6, in which the first gate line 3 is located between the first sub-pixel 1 and a second sub-pixel 2, and the second gate line 4 is located between the second sub-pixel 2 of the sub-pixel structure and the first sub-pixel of an adjacent sub-pixel structure.

In each of the sub-pixel structures, the gate of the TFT for the first sub-pixel 1 is connected to the first gate line 3, the gate of the TFT for the second sub-pixel 2 is connected to the second gate line 4, and for each of the first sub-pixel 1 and the second sub-pixel 2, the source of the respective TFT is connected to the data line 10. Preferably, the first switch devices 6 in the present embodiment are thin film transistors. The first control line 5 is insulated from the first gate lines 3 and the second gate lines 4. For each of the first switch devices 6, its gate is connected to the first control line 5, its source and drain are connected to the first gate line 3 and the second gate line 4 respectively corresponding to the first sub-pixel 1 and the second sub-pixel 2 in the same sub-pixel structure. The first switch devices 6 are controlled by the first control line 5 to be turned on or off, so that the first gate lines 3 and the second gate lines 4 are connected to or disconnected from each other.

An operation of the array substrate will be exemplarily described below:

In the embodiment, an N-type TFT will be explained as an example (when it is of a P type, a control signal for its gate has an opposite polarity). In a 2D display state, a high voltage is inputted to the first control line 5, the first switch devices 6 are turned on, a signal being inputted to the first gate line 3 for the first sub-pixel 1 is simultaneously inputted to the second gate line 4 for the second sub-pixel 2, and at this time, the first sub-pixel 1 and the second sub-pixel 2 are charged by the data line 10 simultaneously, so as to display a picture.

When the display state is changed into a 3D-display state, a black picture is inserted, so that the first sub-pixel 1 and the second sub-pixel 2 both represent black. Then, a low voltage is inputted to the first control line 5, and the first switch devices 6 are turned off, so that a connection between the first gate line 3 and the second gate line 4 are cut off, and the second gate line 4 fails to receive a high-voltage signal. Thereby, the gate of the TFT in the second sub-pixel 2 is turned off because no high potential has been applied, and the second sub-pixel 2 can not be charged by the data line 10. Therefore, the second sub-pixel 2 represents black, and an Active BM is achieved accordingly.

Preferably, an adoption of a "normal black mode" can make the second sub-pixel 2 maintained in a black state favorably. The normal black mode is usually used in IPS, FFS and VA modes, namely, a black picture is shown when a voltage is not applied.

Beneficial Effect

According to the embodiment of the invention, to control the second sub-pixel can be performed more easily by means of adding the first control line and the first switch devices, so that the control difficulty for an active black matrix is reduced and an effect of increasing resolution in a vertical direction is also attained.

Embodiment 2

An example of a control method for the array substrate in the Embodiment 1 of the invention is provided by the embodiment. It will be explained specifically as follows:

In a 2D display state, a signal for turning on the first switch devices 6, i.e. a high-voltage signal is applied to the first control line 5, so that the first switch devices 6 are turned on;

a signal is inputted to the first gate line 3 for the first sub-pixel 1, then the signal is also inputted to the second gate line 4 for the second sub-pixel 2 at this time, and thus, TFTs of the first sub-pixel 1 and the second sub-pixel 2 are turned on simultaneously;

the first sub-pixel 1 and the second sub-pixel 2 are charged by the data line 10 simultaneously.

When the 2D display state is changed into a 3D display state, a black picture is inserted;

then, a signal for turning off the first switch devices 6, i.e. a low-voltage signal is applied to the first control line 5, so that the first switch devices 6 are turned off The signal on the first gate line 3 is merely inputted to the first sub-pixel 1, the TFT of the first sub-pixel 1 is turned on, and only the first sub-pixel 1 is charged by the data line 10.

With the control method, the control cost and control difficulty are reduced and a 3D viewing angle is also improved, as compared to a conventional control method.

Embodiment 3

Figure 5:
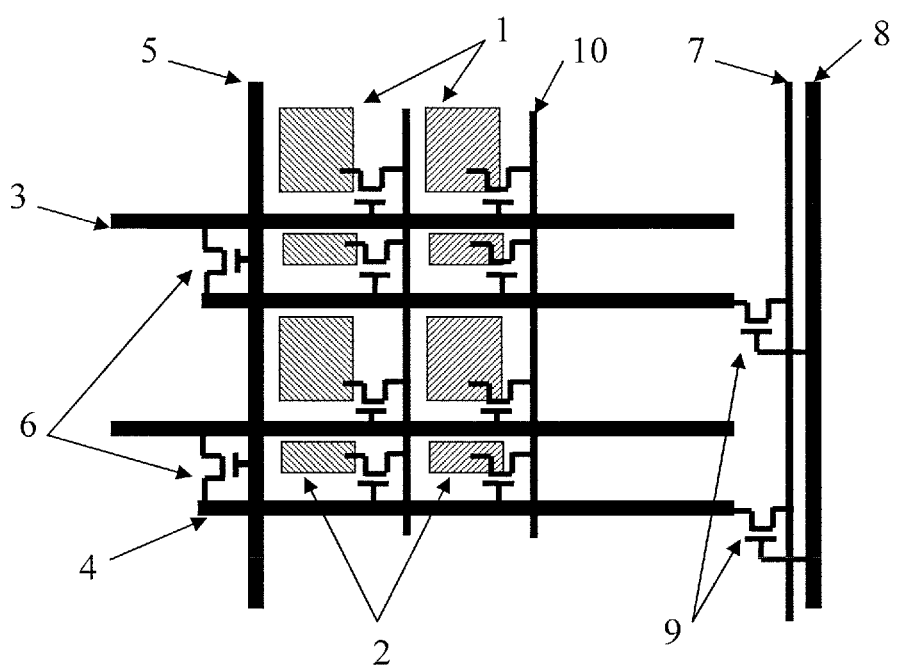
FIG. 5 is a schematic view showing a structure of another array substrate according to an embodiment of the invention.

Another example of an array substrate that can be applied to a 3D display apparatus is provided by the embodiment 3 of the invention, and in the following, the example of the array substrate will be described in detail with reference to FIG. 5.

Because a leakage current may occur in a second sub-pixel 2 in an actual operation, and a voltage across a second gate line 4 for it may be changed after the second gate line 4 is disconnected from a first gate line 3 for a first sub-pixel 1, the leakage current is caused to be increased. The reason for this change is that the second gate line 4 is floated, then charges may be produced through coupling when signals on a gate line and a data line beside it vary, and thereby the voltage across the second gate line 4 is changed. In order to avoid the above phenomenon, according to the array substrate in the embodiment, a second control line 7, a third control line 8 and second switch devices are added on the basis of the embodiment 1, as shown in FIG. 5. Preferably, the second switch devices in the embodiment are second TFTs 9. For each of the second TFTs 9, its gate is connected to the third control line 8, its source and drain are respectively connected to the second control line 7 and a second gate line 4. The second TFTs 9 are controlled by the third control line 8 to be turned on or off, so as to make the second control line 7 being connected to or disconnected from the second gate lines 4.

An operation of the array substrate will be exemplarily described below: (an N-type TFT will be used as an example alike)

Upon the operation, a low voltage (VGL) is continuously inputted to the second control line 7.

In a 2D display state, a low voltage is inputted to the third control line 8, and the second TFTs 9 are turned off, so that the second control line 7 is not connected to the second gate lines 4. A high voltage is inputted to the first control line 5, and the first TFTs 6 are turned on, so that a signal inputted to the first gate line 3 for the first sub-pixel 1 is simultaneously inputted to a second gate line 4 for the second sub-pixel 2. At this time, the first sub-pixel 1 and the second sub-pixel 2 are charged by a data line 10 simultaneously, so as to display a picture.

When the display state is changed into a 3D-display state, a black picture is inserted, so that the first sub-pixel 1 and the second sub-pixel 2 both represent black. Then, a low voltage is inputted to the first control line 5, and the first TFTs 6 are turned off, so that a connection between the first gate line 3 and the second gate line 4 are cut off, and the second gate line 4 fails to receive a high-voltage signal. Meanwhile, a high voltage is inputted to the third control line 8, and the second TFTs 9 are turned on. At this time, a gate for the second sub-pixel 2 is connected to the second control line 7 through the second gate line 4. The low voltage is continuously inputted to the gate for the second sub-pixel 2, so that the gate of the TFT in the second sub-pixel 2 is turned off because no high potential has been applied, and the second sub-pixel 2 can not be charged by the data line 10. Therefore, the second sub-pixel 2 represents black, and thereby functioning as an Active BM. The continuous inputting of the low voltage to the gate for the second sub-pixel 2 also prevents the leakage current of the second sub-pixel 2 from being increased due to a change in a gate voltage.

Preferably, an adoption of a "normal black mode" can make the second sub-pixel 2 maintained in a black state favorably. The normal black mode is usually used in IPS, FFS and VA modes, namely, a black picture is shown when a voltage is not applied.

Beneficial Effect

With the embodiment of the invention, to control the second sub-pixel is achieved more easily by means of adding the first control line and the first switch devices, so that the control difficulty for an active black matrix is reduced and an effect of increasing resolution in a vertical direction is also attained. By way of adding the second control line, the third control line and the second switch devices, a gate voltage for the second sub-pixel is prevented from being changed, and a leakage current of the second sub-pixel is decreased.

Embodiment 4

A control method for the array substrate in the embodiment 3 of the invention is provided by the embodiment. It will be explained specifically as follows:

a low-voltage signal (for turning off a TFT in the second sub-pixel 2) is continuously inputted to the second gate line 4 by the second control line 7, in a 2D display state, a signal for turning off the second TFTs 9, i.e. a low-voltage signal is applied to the third control line 8, and the second TFTs 9 are turned off, so that the second control line 7 is not connected to the second gate lines 4;

a signal for turning on the first TFTs 6, i.e. a high-voltage signal is applied to the first control line 5, and the first TFTs 6 are turned on;

a signal, which is inputted to the first gate line 3 for the first sub-pixel 1, is inputted to the second gate line 4 for the second sub-pixel 2 at the same time;

the first sub-pixel 1 and the second sub-pixel 2 are charged by the data line 10 simultaneously.

when the display state is changed into a 3D display state, a black picture is inserted;

a signal for turning off the first TFTs 6, i.e. a low-voltage signal is applied to the first control line 5, and the first TFTs 6 are turned off.

a signal for turning on the second TFTs 9, i.e. a high-voltage signal is applied to the third control line 8, and the second TFTs 9 are turned on. At this time, the low-voltage signal on the second control line 7 is inputted to the second gate lines 4, so that the TFT in the sub-pixel 2 is turned off.

a signal on the first gate line 3 is inputted to the first sub-pixel 1, and the first sub-pixel 1 is charged by the data line 10.

According to the control method, the control cost and control difficulty are reduced and a 3D viewing angle is also improved, as compared to a conventional control method. Being compared with the control method in the embodiment 2, because the second control line 7, the third control line 8 and the second TFTs 9 are added, a gate voltage for the second sub-pixel 2 is prevented from being changed, and a leakage current of the second sub-pixel 2 is decreased.

Embodiment 5

A display panel is provided by the embodiment. The display panel includes the array substrate in the embodiment 1 or the embodiment 3.

An example of the display panel is a liquid crystal display panel, wherein the array substrate and an opposite substrate are disposed to face each other to form a liquid crystal cell, and a liquid crystal material is filled in the liquid crystal cell. The opposite substrate is a color filter substrate, for example. The pixel electrode of each pixel unit of the TFT array substrate is used to apply an electric field, so as to control a rotation of the liquid crystal material and to perform a displaying operation. In some examples, the liquid crystal display apparatus further comprises a backlight source provided for the array substrate.

Another example of the display panel is an organic light emitting display (OLED) panel, wherein a pixel electrode of each pixel unit of the array substrate is used as an anode or a cathode to drive an organic light-emitting material to emit light so as to perform a displaying operation.

Embodiment 6

A 3D display apparatus is further provided by an embodiment of the invention, and a display panel of the display apparatus is the display panel in the embodiment 5. In the display apparatus, control-signal interfaces corresponding to the first control line 5, the second control line 7 and the third control line 8 are further provided. According to the display apparatus, a 3D viewing angle in a 3D display state is raised.

The above embodiments are merely used to explain the invention, but not to set a limit on the present invention. Various modifications and variations can be further made by those ordinarily skilled in the related technical field without departing from the spirit and scope of the present invention. Therefore, all of equivalent technical solutions also come within the scope of the present invention, and the patent protection scope of the present invention shall be defined by claims.

What is claimed is:

1. An array substrate, comprising:
   data lines;
   first gate lines and second gate lines, the first and second gate lines and the data lines crossing with each other so as to define a plurality of sub-pixel structures arranged in a matrix form; each of the plurality of sub-pixel structures comprising a first sub-pixel and a second sub-pixel, and each of the first sub-pixel and the second sub-pixel including a pixel electrode and a thin film transistor, the thin film transistor for each of them comprising a gate, a source, a drain and an active layer;
   a first control line, insulated from the first gate lines and the second gate lines; and
   first switch devices, each for making the first gate line and the second gate line corresponding to the first sub-pixel and the second sub-pixel in the same sub-pixel structure connected or disconnected under the control of the first control line; and
   a second control line, a third control line and second switch devices each of the second switch devices for making the second control line and the second gate lines connected or disconnected under the control of the third control line,
   wherein in each of the stab-pixel structures, the first gate line is connected to the first sub-pixel, the second gate line is connected to the second sub-pixel, and the first sub-pixel and the second sub-pixel are connected to the same data line.

2. The array substrate claimed as claim 1, wherein each of the first switch devices is a first TFT, a gate of the first TFT is connected to the first control line, and a source and a drain thereof are connected to the first gate line and the second gate line, respectively.

3. The array substrate claimed as claim 1, wherein each of the second switch devices is a second TFT, a gate of the second TFT is connected to the third control line, and a source and a drain thereof are connected to the second control line and the second gate lines, respectively.

4. A control method for the array substrate claimed as claim 1, comprising: in a 2D-display state,
   applying a signal for turning on the first switch devices to the first control line, so that the first switch devices are turned on;

inputting a signal, which is inputted to the first gate line for the first sub-pixel, to the second gate line for the second sub-pixel simultaneously;

charging the first sub-pixel and the second sub-pixel by the data line at the same time;

inserting a black picture when switching to a 3D display state;

applying a signal for turning off the first switch devices to the first control line, so that the first switch devices are turned off;

inputting a signal on the first gate line only to the first sub-pixel, and charging the first sub-pixel by the data line.

5. The control method for the array substrate claimed as claim 4, wherein the array substrate further comprises:

a second control line, a third control line and second switch devices, the second switch devices for making the second control line and the second gate lines being connected or disconnected under the control of the third control line.

6. The control method for the array substrate claimed as claim 5, further comprising:

inputting a signal for turning off the TFT in the second sub-pixel continuously to the second gate line by the second control line;

in the 2D display state, applying a signal for turning off the second switch devices to the third control line, so that the second switch devices are turned off;

in the 3D display state, applying a signal for turning on the second switch devices to the third control line, so that the second switch devices are turned on.

7. A display panel, comprising;

the array substrate claimed as claim 1;

a counter substrate, the counter substrate and the array substrate being disposed opposite to each other so as to form a liquid crystal cell;

liquid crystal material, filled in the liquid crystal cell, wherein the pixel electrodes for each of the sub-pixel structures of the array substrate are used to apply an electric field for controlling the rotation degree of the liquid crystal material, thereby performing a display operation.

8. The display panel claimed as claim 7, wherein the counter substrate is a color filter substrate.

9. The display panel claimed as claim 7, further comprising a backlight source for providing the array substrate with backlight.

* * * * *

UNITED STATES PATENT AND TRADEMARK OFFICE
CERTIFICATE OF CORRECTION

PATENT NO.         : 9,171,520 B2
APPLICATION NO.    : 13/703799
DATED              : October 27, 2015
INVENTOR(S)        : Yanbing Wu Page 1 of 1

It is certified that error appears in the above-identified patent and that said Letters Patent is hereby corrected as shown below:

In the Claims

In claim 1, line 20 (column 8, line 44), delete "devices each" and insert -- devices, each" --;

In claim 1, line 24 (column 8, line 48), delete "stab-pixel" and insert -- sub-pixel" --.

Signed and Sealed this
Seventeenth Day of May, 2016

Michelle K. Lee
*Director of the United States Patent and Trademark Office*